US012765023B2

(12) United States Patent
Nicholls et al.

(10) Patent No.: US 12,765,023 B2
(45) Date of Patent: Oct. 13, 2026

(54) POLAR SEMICONDUCTOR SUPERLATTICE WITH ENERGY BARRIER

(71) Applicant: Silanna UV Technologies Pte Ltd, Singapore (SG)

(72) Inventors: Jordan Roy Nicholls, Hamilton (AU); Petar Atanackovic, Henley Beach South (AU)

(73) Assignee: Silanna UV Technologies Pte Ltd, Singapore (SG)

( * ) Notice: Subject to any disclaimer, the term of this patent is extended or adjusted under 35 U.S.C. 154(b) by 111 days.

(21) Appl. No.: 18/916,469

(22) Filed: Oct. 15, 2024

(65) Prior Publication Data

US 2026/0107531 A1 Apr. 16, 2026

(51) Int. Cl.
*H10D 62/815* (2025.01)
*H10D 62/85* (2025.01)

(52) U.S. Cl.
CPC ..... *H10D 62/8164* (2025.01); *H10D 62/8503* (2025.01)

(58) Field of Classification Search
CPC ........................................ H10D 62/8161–8164
See application file for complete search history.

(56) References Cited

U.S. PATENT DOCUMENTS 5,841,151 A * 11/1998 Sahara ................ G02F 1/01725 257/14
6,288,410 B1 * 9/2001 Miyazawa ............. B82Y 20/00 257/97
7,488,970 B2 * 2/2009 Ohta .................. H10D 62/8164 257/17
9,401,452 B2 * 7/2016 Northrup ............. H10H 20/812
10,141,477 B1 11/2018 Bhusal et al.
11,296,256 B2 4/2022 Lin et al.
(Continued)

FOREIGN PATENT DOCUMENTS

CN 101740681 A 6/2010
CN 109950375 A 6/2019
(Continued)

OTHER PUBLICATIONS

International Search Report and Written Opinion dated Dec. 4, 2025 for PCT Patent Application No. PCT/IB2025/058082.
(Continued)

*Primary Examiner* — Daniel Luke
(74) *Attorney, Agent, or Firm* — MLO, a professional corp.

(57) ABSTRACT

The present disclosure relates to a semiconductor structure including a superlattice with repeating unit cells of a narrow bandgap (NBG) layer and a wide bandgap (WBG) layer. The NBG and WBG layers include an NBG and a WBG polar semiconductor material, respectively. An energy barrier region is in contact with the superlattice, including a total of N layers of alternating the WBG and NBG polar semiconductor materials, wherein a total thickness of the energy barrier region is equal to a thickness of N/2 unit cells of the superlattice, and wherein N is an even number greater than or equal to 4. Layers of the N layers of the energy barrier region, either WBG layers or NBG layers, are both thicker and thinner than a corresponding layer (either WBG or NBG) of the unit cell of the superlattice to form the energy barrier.

20 Claims, 7 Drawing Sheets

(56) References Cited

U.S. PATENT DOCUMENTS

| | | | | |
|---|---|---|---|---|
| 2005/0067629 | A1* | 3/2005 | Woodall | H10D 62/60 257/E29.189 |
| 2010/0078660 | A1 | 4/2010 | Moriyama et al. | |
| 2011/0187294 | A1 | 8/2011 | Bergmann et al. | |
| 2012/0140785 | A1 | 6/2012 | Nakagawa et al. | |
| 2015/0179881 | A1 | 6/2015 | Senes et al. | |
| 2015/0280056 | A1 | 10/2015 | Northrup et al. | |
| 2016/0315449 | A1 | 10/2016 | Shatalov et al. | |
| 2017/0207243 | A1 | 7/2017 | Kao et al. | |
| 2018/0240936 | A1 | 8/2018 | Hong et al. | |
| 2019/0103509 | A1 | 4/2019 | Lachab | |
| 2019/0115497 | A1 | 4/2019 | Zhang et al. | |
| 2020/0243717 | A1 | 7/2020 | Sato et al. | |
| 2021/0143298 | A1 | 5/2021 | Tosi et al. | |
| 2022/0238754 | A1 | 7/2022 | Tang et al. | |

FOREIGN PATENT DOCUMENTS

| | | | |
|---|---|---|---|
| CN | 111370548 | A | 7/2020 |
| CN | 112563381 | A | 3/2021 |
| EP | 2709170 | A2 | 3/2014 |
| JP | 2000068594 | A | 3/2000 |
| JP | 2017069388 | A | 4/2017 |

OTHER PUBLICATIONS

International Search Report and Written Opinion dated Feb. 2, 2026 for PCT Patent Application No. PCT/IB2025/060200.

Office Action dated Jun. 18, 2026 for U.S. Pat. No. 18/626,130.

Office Action dated May 26, 2026 for China Patent Application No. 202180032447.5.

* cited by examiner

Electron Barrier with flat top
(changing the WBG width)

Electron Barrier
(changing both widths)

Increased the WBG widths, but
didn't decrease them

Changed the WBG widths, but
nonequal no. of replaced layers

POLAR SEMICONDUCTOR SUPERLATTICE WITH ENERGY BARRIER

BACKGROUND

Many semiconductor devices use energy barriers, which are either electron barriers or hole barriers, located inside a structure with layers of semiconductors. Energy barriers can play a key role in performance. For example, in optoelectronic devices, electron barriers are often employed to control the supply of electrons to the active region (electron slowing layer) and to prevent them from escaping the active region (electron blocking layer).

Electron and hole barriers are typically formed by modulating either the material composition or the doping density as a function of position to form a barrier to the movement of electrons or holes within the structure. For example, doping modulation can be used to form energy barriers in unipolar devices with materials capable of high levels of n- and p-type doping. In another example, composition modulation can be used to form an energy barrier, whereby a different material is inserted in a structure that is made using compatible materials and growth processes.

SUMMARY

In some embodiments, a semiconductor structure includes: a superlattice including repeating unit cells, wherein each unit cell includes a narrow bandgap (NBG) layer including an NBG polar semiconductor material, and a wide bandgap (WBG) layer including a WBG polar semiconductor material; and an energy barrier region in contact with the superlattice, the energy barrier region including a total of N layers, wherein N is an even number greater than or equal to 4, half of the N layers include the WBG polar semiconductor material, half of the N layers include the NBG polar semiconductor material, the layers of the N layers including the WBG polar semiconductor material alternate with the layers of the N layers including the NBG polar semiconductor material, and a total thickness of the energy barrier region is equal to a thickness of N/2 unit cells of the superlattice; wherein a first energy barrier layer of the N layers of the energy barrier region that includes the WBG polar semiconductor material is thicker than the WBG layer of the unit cell of the superlattice, and a second energy barrier layer of the N layers of the energy barrier region that includes the WBG polar semiconductor material is thinner than the WBG layer of the unit cell of the superlattice.

In some embodiments, a semiconductor structure includes: a superlattice including repeating unit cells, wherein each unit cell includes a narrow bandgap (NBG) layer including an NBG polar semiconductor material, and a wide bandgap (WBG) layer including a WBG polar semiconductor material; and an energy barrier region in contact with the superlattice, the energy barrier region including a total of N layers, wherein N is an even number greater than or equal to 4, half of the N layers include the WBG polar semiconductor material, half of the N layers include the NBG polar semiconductor material, the layers of the N layers including the WBG polar semiconductor material alternate with the layers of the N layers including the NBG polar semiconductor material, and a total thickness of the energy barrier region is equal to a thickness of N/2 unit cells of the superlattice; wherein a first energy barrier layer of the N layers of the energy barrier region that includes the NBG polar semiconductor material is thicker than the NBG layer of the unit cell of the superlattice, and a second energy barrier layer of the N layers of the energy barrier region that includes the NBG polar semiconductor material is thinner than the NBG layer of the unit cell of the superlattice.

In some embodiments, a semiconductor structure includes: a superlattice including repeating unit cells, wherein each unit cell includes a narrow bandgap (NBG) layer including an NBG polar semiconductor material, and a wide bandgap (WBG) layer including a WBG polar semiconductor material; and an energy barrier region in contact with the superlattice, wherein the energy barrier region includes: a total of N layers, wherein N is an even number greater than 4, half of the N layers include the WBG polar semiconductor material, half of the N layers include the NBG polar semiconductor material, and the layers of the N layers including the WBG polar semiconductor material alternate with the layers of the N layers including the NBG polar semiconductor material; a total thickness equal to a thickness of N/2 unit cells of the superlattice; a first energy barrier region bilayer including two adjacent layers of the N layers, wherein a thickness of the first energy barrier region bilayer is greater than thickness of the unit cell of the superlattice; and a second energy barrier region bilayer including two adjacent layers of the N layers, wherein a thickness of the second energy barrier region bilayer is less than thickness of the unit cell of the superlattice.

BRIEF DESCRIPTION OF THE DRAWINGS

Embodiments of the present disclosure will be discussed with reference to the accompanying drawings.

In the following description, like reference characters designate like or corresponding parts throughout the figures.

DETAILED DESCRIPTION

Figure 1A:
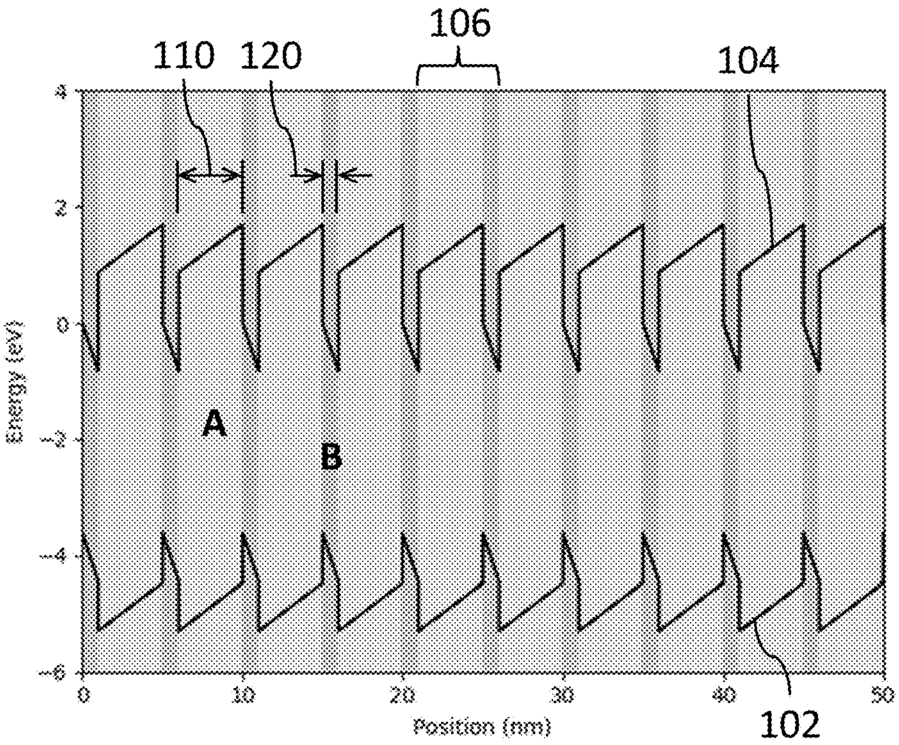
FIG. 1A shows an example band diagram of a superlattice (SL), with a valence band edge and a conduction band edge.

This disclosure describes structures, devices, and methods including energy barriers in superlattice (SL) semiconductors containing polar semiconductor materials. The energy barriers described herein can be used as electron barriers or hole barriers with different energy barrier heights and thicknesses along a growth direction.

Polarized SL structures containing polar semiconductor materials are an important subclass of semiconductor structures. Superlattices (SLs) are periodic nanostructures including a repeating sequence of two or more discrete material layers. The SLs described herein include repeating unit cells, where the unit cells contain two or more layers with different bandgaps from one another. The SLs described herein also contain sets of polar materials, where a piezoelectric charge is induced at each interface inside the SL. The most common polar semiconductor materials have a wurtzite crystal structure; however, the structures, devices and methods described herein can utilize semiconductor materials with other polar crystal structures.

In general, engineering an energy barrier in a semiconductor structure is a difficult problem and there is no general method of forming an energy barrier of a specified height and/or width. Furthermore, it is difficult to ensure that any changes made to the local band structure do not cause unintended consequences to the band alignment in the rest of the device.

Electron and hole barriers are conventionally formed by modulating either the material composition or the doping as a function of position. However, both of these approaches can only be used in certain situations and are not generally applicable. For example, doping modulation is only applicable to unipolar devices, since adding an additional doped region will significantly alter the operation of a bipolar device. Furthermore, not all semiconductors are capable of high levels of n- and p-type doping that are used in energy barriers. Additionally, inserting a layer of different material (composition modulation) is limited by the available materials that are compatible with the growth process and crystal structure. As such, there are limitations on the achievable height of an energy barrier made using conventional composition modulation methods.

In contrast, the structures, devices, and methods described herein form energy barriers (electron and/or hole barriers) in contact with an SL, or within an SL, without altering the band alignment in the SL(s). In some cases, the SL contains alternating layers of wide bandgap (WBG) and narrow bandgap (NBG) polar semiconductor materials. In such cases, a unit cell of the SL contains one WBG layer and one NBG layer, and a period of the SL (i.e., a thickness of the unit cell) is the thickness of the WBG layer added to the thickness of the NBG layer. In other cases, the repeating unit cell of the SL can include three or more layers. An energy barrier region can be formed within the SL, such that the SL band alignment is maintained on both sides of the energy barrier region. The energy barrier can be present when no external bias or electric field is applied to the structure. The energy barrier can also be present when a positive or negative bias is applied across the structure.

The energy barrier regions described herein include alternating layers of WBG and NBG polar semiconductor materials, where thicknesses of the WBG layers and/or NBG layers in the energy barrier are changed compared to the corresponding layers in the adjacent SL(s). In order to maintain the SL band alignment across the energy barrier region, the total number of interfaces between WBG and NBG layers is the same in the energy barrier region as in the SL being replaced. Additionally, a total thickness of the energy barrier region is equal to the total number of layers in the energy barrier region (i.e., the number of WBG layers and NBG layers combined) divided by two, times the period of the SL. In equation form this relationship can be expressed as, [barrier region thickness]=[total # of layers in barrier region/2]*[SL period].

For example, the energy barrier regions described herein can include an even number of layers, wherein the number of layers is from about 4 to about 100, or from about 4 to about 20, or from about 4 to about 10, or from about 10 to about 100, or from about 10 to about 50, or from about 10 to about 20. In some cases, the energy barrier region can have more than 4 layers, more than 10 layers, more than 20 layers, or more than 100 layers. In some cases, the thicknesses of the WBG and/or NBG layers of the energy barrier region can be from about 0.1 nm to about 20 nm, or from about 0.1 nm to about 10 nm, or from about 1 nm to about 20 nm, or from about 1 nm to about 10 nm. In some cases, the thicknesses of the WBG and/or NBG layers of the energy barrier region can be from about 1 monolayer (ML) to about 80 ML, or from about 1 ML to about 40 ML, or from about 4 ML to about 80 ML, or from about 4 ML to about 40 ML. An ML is a single layer of atoms or molecules. For example, in nitride materials, an ML is a layer of metal atoms and nitrogen atoms bonded to the metal atoms. Hence, a unit cell of a wurtzite nitride material contains two MLs, which are laterally offset from one another. Therefore, one ML is a unit of length equal to a dimension of one monolayer of an epitaxial crystalline material in a growth direction (approximately perpendicular to a plane of the substrate). For example, 1 ML is about 0.25 nm for AlGaN materials.

In some cases, the thicknesses of the WBG and/or NBG layers of the energy barrier region can be less than 1 ML, or be a fraction of an ML. For example, in some cases, the thicknesses of the WBG and/or NBG layers of the energy barrier region can be from about 0.1 monolayer (ML) to about 80 ML, or from about 0.1 ML to about 40 ML, or from about 0.5 ML to about 80 ML, or from about 0.5 ML to about 40 ML. However, if the thickness of a layer less than 1 ML is changed (e.g., from 0.3 ML to 0.6 ML), then such a change in thickness may not increase or decrease the conduction and valence bands as described herein (e.g., in FIGS. 1A-2F) to form an electron or a hole barrier. Changing the "thickness" of a layer less than 1 ML can change the total coverage of the species within the layer, but not the physical extent (i.e., a physical thickness) of the layer in the growth direction. In a layer with a thickness less than 1 ML, the total coverage is akin to changing the average interface charge density (more or less of surface is covered, so more or less charge overall). Therefore, WBG and/or NBG layers of the energy barrier region can be less than 1 ML in some cases, but in other cases layers less than 1 ML may not form an energy barrier. For example, an SL structure with 0.4 ML NBG layers and a 10 ML WBG layers can form an energy barrier as described herein (e.g., in FIGS. 1A-2F) by changing the thicknesses of the WBG layers within the energy barrier. On the other hand, if the 0.4 ML NBG layer thicknesses in this SL structure were changed to 0.2 ML and to 0.8 ML, then only the total coverage would change, and the structure would not form an energy barrier as described herein (e.g., in FIGS. 1A-2F).

The WBG and NBG polar semiconductor materials of the structures, devices and methods described herein can be any polar semiconductor crystalline material that can form an epitaxial SL structure. In some cases, the WBG and NBG polar semiconductor materials can be a nitride material with a wurtzite crystal structure, such as BN, GaN, AlN, AlGaN (e.g., $Al_xGa_{1-x}N$, where 0≤x≤1), InAlGaN (e.g., $In_xAl_yGa_{1-x-y}N$, where 0≤x≤1, 0≤y≤1, and x+y≤1), BAlN (e.g., $B_xAl_{1-x}N$, where 0≤x≤1), BGaN (e.g., $B_xGa_{1-x}N$, where 0≤x≤1), or BAlGaN (e.g., $B_xAl_yGa_{1-x-y}N$, where 0≤x≤1, 0≤y≤1, and x+y≤1), or other group III-nitride binary, ternary, or quaternary material. For example, the WBG polar semiconductor material can be AlN and the NBG polar semiconductor material can be GaN. Binary, ternary or quaternary compositions can be used for the WBG and NBG layers. For example, both of the WBG and NBG polar semiconductor materials can be $Al_xGa_{1-x}N$ (where 0≤x≤1), where the WBG polar semiconductor material has a first value of x, and the NBG polar semiconductor material has a second value of x that is lower than the first value. In another example, both of the WBG and NBG polar semiconductor materials can be $In_xAl_yGa_{1-x-y}N$ (where 0≤x≤1, 0≤y≤1, and x+y≤1) with different compositions such that the WBG polar semiconductor material has a higher bandgap than that of the NBG polar semiconductor material.

In some embodiments, one or more layers of the SLs and/or the energy barrier region is not intentionally doped with an impurity species. Alternatively or additionally, one or more layers of the SLs and/or the energy barrier region is intentionally doped with one or more impurity species. For example, the one or more impurity species for an n-type layer can include silicon (Si) or germanium (Ge). For example, the one or more impurity species for a p-type layer can include magnesium (Mg) or zinc (Zn). The one or more impurity species in the n-type active region or the p-type active region can also be selected from: hydrogen (H); oxygen (O); carbon (C); or fluorine (F).

At least a portion of at least one of the one or more SLs and/or energy barrier regions described herein can include a uniaxial strain, a biaxial strain or a triaxial strain. In some cases, the strain can modify a level of activated impurity doping. That is, by the action of crystal deformation in at least one crystal direction, the induced strain can deform advantageously the energy band structure of the materials in the layers of the one or more SLs. The resulting energy shift of the conduction or valence band edges can then be used to reduce the activation energy of a given impurity dopant relative to the SL.

The layers of the SLs and the energy barrier regions described herein are epitaxially formed single crystal layers, and the thickness of each of the layers is below a critical thickness. The critical thickness is the limit of film thickness wherein the strain in the film is elastically accommodated. If a layer is grown thicker than its critical thickness it can relax, and dislocations and other defects can form in the layer. Defects in a layer can degrade the material quality and reduce the performance of electronic devices with the layer. The critical thickness depends on the in-plane lattice constant mismatch between the layer and the layer upon which it is grown (e.g., a substrate, or an epitaxial layer on a substrate), as well as other materials properties of the layer and the layer upon which it is grown. In some cases, the critical thickness can be from about 5 nm to about 20 nm, or from about 10 nm to about 20 nm, but in other cases, it can be less than about 5 nm or greater than about 20 nm.

In some cases, the SL and energy barrier structures described herein are strain-balanced. A strain-balanced structure includes alternating layers with different in plane lattice constants, such that layers having in-plane lattice constants greater than the underlying layer are alternated with layers having in-plane lattice constants less than the underlying layer. Such structures alternate between tensile and compressive strain, which can enable thicker layer to be grown without relaxing. For example, NBG or WBG layers in an SL and energy barrier can include an in plane lattice constant that is less than an underlying layer, while the alternating WBG or NBG layers can include an in plane lattice constant that is greater than the underlying layer. For example, AlN has a smaller lattice constant than GaN, while InN has a larger lattice constant than GaN. Therefore, InAlGaN materials (e.g., InxAlyGa1-x-yN, where 0≤x≤1, 0≤y≤1, and x+y≤1) can be used in strain-balanced SLs and energy barriers.

The SLs and energy barrier regions of the structures described herein include epitaxial layers of crystalline polar semiconductor materials. Some examples of epitaxial growth techniques that can be used to form the structures described herein include molecular beam epitaxy (MBE), gas source molecular beam epitaxy (GS-MBE), plasma-source MBE (P-MBE), metal-organic chemical vapor deposition (MOCVD), atomic layer deposition (ALD), vacuum-based laser ablation sources, vapor phase epitaxy (VPE), and gas source, sputter source, electron beam evaporation source, and plasma-based deposition methods.

The SLs and the energy barrier regions described herein can be used in any semiconductor device containing epitaxial layers of polar semiconductor materials. For example, the devices can include diodes, transistors, switches, high-frequency (e.g., RF) devices, light emitting devices, light emitting diodes (LEDs), lasers, light sensing devices, image sensors, and photodetectors. The energy barrier regions can be used to insert a barrier to electrons and/or holes in the devices, which can be useful to tune the electrical properties of the devices (e.g., series resistance). For example, the energy barrier regions can be used to confine electrons and/or holes or exclude electrons and/or holes from certain regions of a device.

In some cases, the SLs and energy barriers described herein can be used in a light emitting device, such as a light emitting diode or a laser, to prevent carriers from escaping the active region of the device. For example, an energy barrier can be positioned next to an SL that is at the edge of, in contact with, or adjacent to, the active region of a light emitting device.

In some cases, the SLs and energy barriers described herein can be used in a light emitting diode, to limit the supply of one carrier type to the active region of the device. This can be helpful to ensure that radiative recombination is the dominant recombination mechanism over the various non-radiative mechanisms in the active region. For example, an energy barrier can be positioned next to an SL that is between a contact injecting a carrier (electron or hole) and the active region of the device.

In some cases, the SLs and energy barriers described herein can be used in a transistor to assist in confining carriers to the channel region of the device. For example, an energy barrier can be positioned next to an SL that is at the edge of, in contact with, or adjacent to, the channel region of a transistor.

In some cases, the SLs and energy barriers described herein can be used in a semiconductor device containing epitaxial layers of polar semiconductor materials (e.g., those listed above) to prevent or reduce the magnitude of parasitic leakage currents, especially at elevated temperatures. For example, an energy barrier can be positioned next to an SL that is in contact with, or adjacent to one or more metal contacts of a device. In other examples, an energy barrier can be positioned next to an SL that is within an n-type region, a p-type region, an intrinsic (or not intentionally doped) region, an active region, or other region of a device.

In some cases, the SLs and energy barriers described herein can be used in a semiconductor device containing epitaxial layers of polar semiconductor materials (e.g., those listed above) to modify the band structure near a metal contact to a superlattice in order to promote Ohmic behavior, for example, via a tunneling current. For example, an energy barrier can be positioned next to an SL that is in contact with, or adjacent to one or more metal contacts of a device.

In some cases, the SLs and energy barrier regions of the structures, devices and methods described herein contain materials with a wurtzite crystal structure, which experience both piezo- and pyroelectric polarization fields due to their polar crystal structure. At an interface between two wurtzite materials (e.g., grown on c-axis), there is a build-up of charges due to the different internal polarization fields of the two materials. When grown as an SL, each period of the SL will have a certain net charge due to the polarization charges at each interface. Not to be limited by theory, by Gauss' law (one of Maxwell's equations), the electric field leaving a period of the SL is proportional to this net charge. However, Gauss' law specifies that this field does not depend on the distribution of those charges. As such, if we replace one or more periods of an SL with a different structure that has the same overall thickness and charge, then the field outside of the new region will be indistinguishable from a structure where no change to the SL had been made. Therefore, an energy barrier region can be formed without changing the electric fields in the remainder of the device (i.e., outside of the modified energy barrier region).

Within the SL or the energy barrier region, the interface charges only depend on the interface materials, and are generally not dependent on the thicknesses of each layer in the SL. Therefore, if the number of layers and their order is not changed, then the total charge within the region that has been replaced will be unchanged (since the number of interfaces and their types are the same as the original SL). The individual widths of each layer in the energy barrier region can be adjusted freely to form an electron or a hole barrier, however, the total width of the SL structure remains unchanged by ensuring that the total thickness of all materials (summed over all SL periods that are being replaced) is also unchanged. In some cases, an energy barrier can be formed where the number of layers and the order of the layers of the unit cell are not changed within the energy barrier region, and the total charge within the region that has been replaced will be unchanged (since the number of interfaces and their types are the same as the original SL). Additionally, the individual widths of each layer in the energy barrier region can be adjusted to form an electron or a hole barrier, and the total width of the SL structure can remain unchanged by ensuring that the total thickness of all materials (summed over all SL periods that are being replaced) is also unchanged.

Within the above constraints, an electron or hole barrier can be formed within an SL structure of almost arbitrary height and width (limited only by the polarization field strengths in each material), provided that enough periods of the SL are replaced.

FIG. 1A shows an example band diagram of an SL, with a valence band edge 102 and a conduction band edge 104 shown. The x-axis is position (in nm) along a growth direction (i.e., approximately perpendicular to a major surface or a substrate upon which the layered stack is formed), and the y-axis is energy (in eV). The SL has a repeating unit cell 106 containing a WBG layer (layer "A") and an NBG layer (layer "B"). The WBG layer contains a polar semiconductor with a bandgap of approximately 6 eV (AlN in this example) and the NBG layer contains a polar semiconductor with a bandgap of approximately 3.4 eV (GaN in this example). The polar nature of the semiconductor materials of the WBG and the NBG layers introduce charge at the interfaces within the SL, which causes electric fields in each of the layers of the SL and the saw-tooth character of the band diagram shown in FIG. 1A. The electric fields cause the bands of the polar materials to increase or decrease energy with position, rather than be flat. The WBG layers of the SL in this example each have thickness 110 (4 nm in this example), and the NBG layers of the SL each have thickness 120 (1 nm in this example). In other cases, the bandgaps and the thicknesses of the WBG and NBG layers can be different from those shown in this example.

Figure 1B:
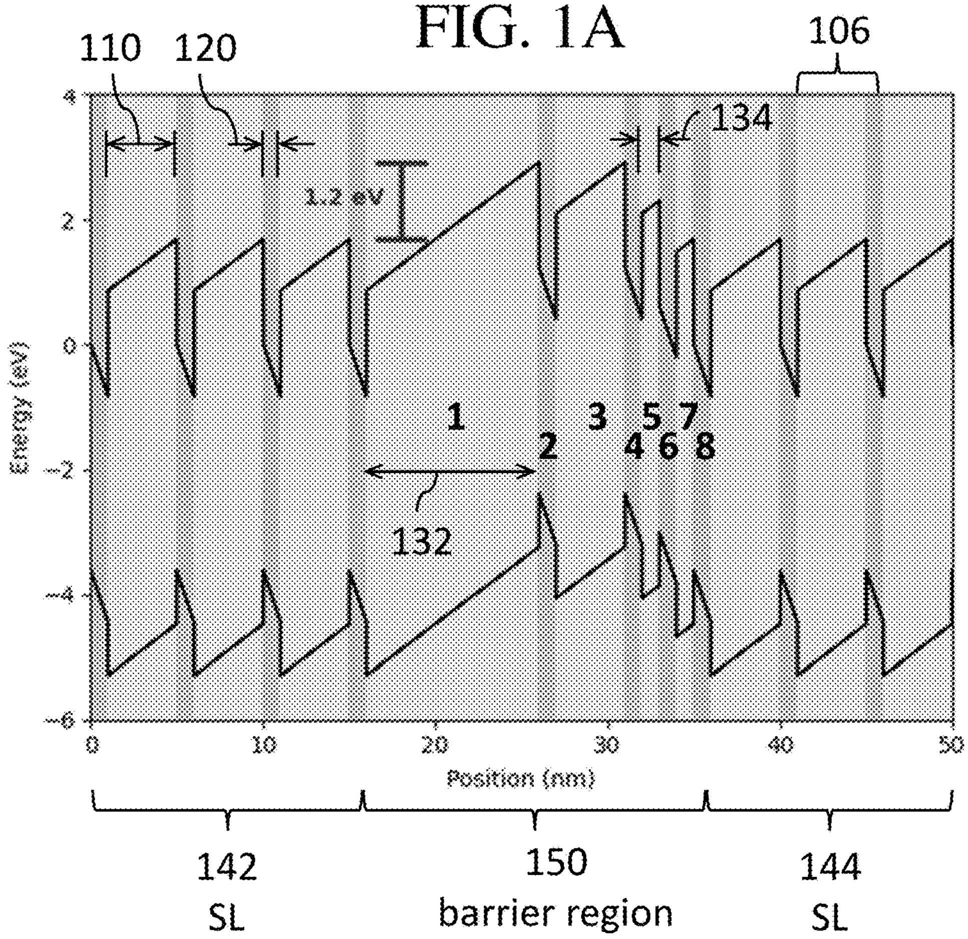
FIG. 1B shows an example band diagram of an SL with an energy barrier region, which is an electron barrier, embedded between a first SL and a second SL, in accordance with some embodiments.

FIG. 1B shows an example band diagram of an SL in contact with an energy barrier region 150, an electron barrier in this case, embedded between a first SL 142 and a second SL 144, in accordance with some embodiments. The energy barrier region contains 8 layers in this example, labeled layers "1" through "8" in the figure. The thicknesses of some of the layers that make up the energy barrier have thicknesses that are different than the thicknesses 110 and 120 of the WBG and NBG layers of the SL. Additionally, since the barrier region contains eight layers, the total thickness of the barrier region is the same as four periods of the SL. By changing the thicknesses of the WBG layers "1", "3," "5," and "7," compared to thickness 110 of the WBG layers of the SL, the barrier region in this example forms a roughly 1.2 eV barrier for electrons, and the bands of the SL on both sides of the barrier region are aligned in energy.

The barrier region 150 contains one WBG layer (layer "1") with a thickness 132 that is greater than the SL WBG layer thickness 110, and two WBG layers (layers "5" and "7") with thicknesses 134 that are less than the SL WBG layer thickness 110. In this example, the total thickness of all materials of the energy barrier region 150 summed over all four periods that are being replaced has been made the same as four periods of the SL by using layers with thicknesses 132 and 134 that are both greater than and less than the SL WBG layer thickness 110. This allows the SLs 142 and 144 surrounding energy barrier region 150 to be aligned in energy.

Continuing with the example shown in FIG. 1B, four periods in the SL are replaced with an energy barrier region 150 following the methods described herein. The inserted structure still contains eight total layers of alternating NBG (GaN) and WBG (AlN), which allows the charge to be unchanged. The WBG (AlN) layers "1", "3," "5," and "7," in this new structure are 10 nm, 4 nm, 1 nm, and 1 nm, respectively, thick (which adds up to 16 nm total, equal to the 4 layers of 4 nm of WBG layers that were replaced). The NBG (GaN) layers in energy barrier region 150 are each 1 nm as in the original SL structure. Due to the design of the energy barrier region, and the direction of the polarization fields in this example, an electron barrier forms with a maximum height of 1.2 eV. Additionally, due to the thicknesses and the numbers of layers in the energy barrier region 150, the band structure in the SLs 142 and 144 outside of the barrier region 150 is not affected.

An energy barrier region similar to energy barrier region 150 in FIG. 1B can be formed using other types of polarized materials within other types of SLs. For example, the SL can include 2 layers, as shown in FIGS. 1A and 1B, or can include unit cells with more than 2 layers in some cases. Energy barriers can be formed that are electron barriers (or equivalently, hole wells) and hole barriers (equivalent to an electron well), or a combination of these using the structures and methods described herein.

FIGS. 2A-2F show several examples of semiconductor structures similar to the structure shown in FIG. 1B, where each includes an energy barrier region embedded within an SL. Reference bands (e.g., valence band edge 202 and conduction band edge 204 in FIG. 2A) are shown for the SL layers that have been replaced by the energy barrier regions in these figures.

The examples in FIGS. 2A-2F represent metal-polar wurtzite materials (e.g., AlGaN materials), which have a polarization axis along the growth direction. In other cases, the wurtzite materials can be nitrogen-polar, and the field directions in the WBG and NBG materials would be inverted. For example, the structure shown in FIG. 2B would become an electron barrier and the structure in FIG. 2A would become a hole barrier if N-polar oriented materials were used instead of materials that are oriented metal-polar. In other material systems (e.g., those where strain is required to generate the polarization charge), the polarity can be different in each layer of the superlattice.

Figure 2A:
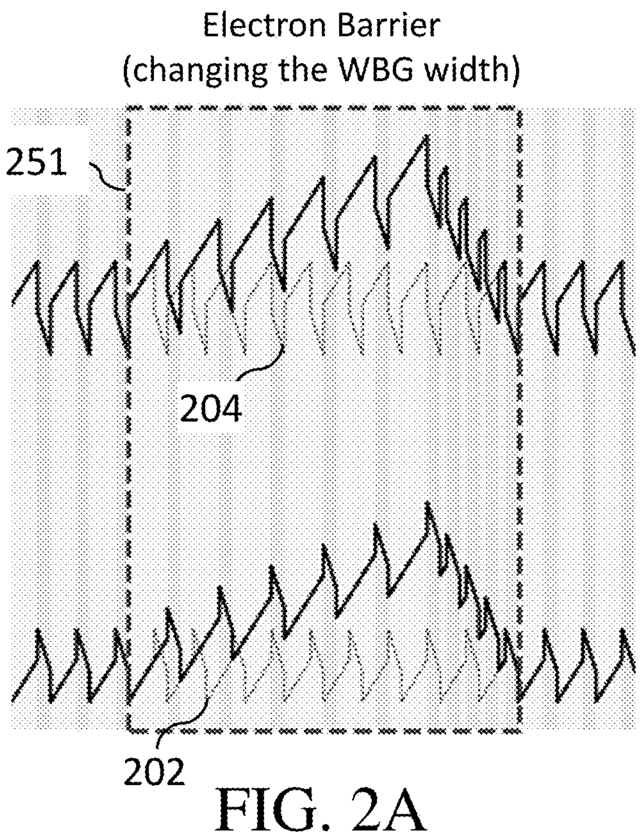
FIG. 2A shows an example band diagram of an SL with an energy barrier region, which is an electron barrier, embedded within an SL, in accordance with some embodiments.

FIG. 2A shows an example band diagram of an SL with an energy barrier region 251, which is an electron barrier in this case, embedded within an SL, in accordance with some embodiments. The energy barrier region 251 is an electron barrier, which contains 20 total layers (i.e., N=20), 10 WBG layers and 10 NBG layers. The thicknesses of the WBG layers in the energy barrier region 251 have been changed to form the electron barrier, such that some of the WBG layers in energy barrier region 251 are thicker than the WBG layers in the surrounding SL, and some of the WBG layers are thinner than the WBG layers in the surrounding SL. The total thickness of energy barrier region 251 is the same as 10 periods of the surrounding SL (i.e., N/2 periods, or N/2 unit cell thicknesses), and the SL on both sides of the energy barrier region 251 are aligned in energy.

Figure 2B:
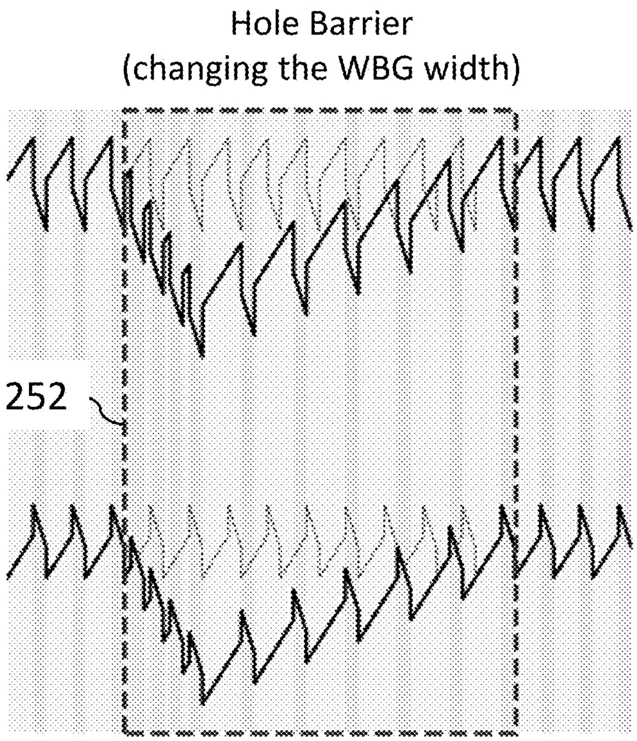
FIG. 2B shows an example band diagram of an SL with an energy barrier region, which is a hole barrier, embedded within an SL, in accordance with some embodiments.

FIG. 2B shows an example band diagram of an SL with an energy barrier region 252, which is a hole barrier in this case, embedded within an SL, in accordance with some embodiments. The energy barrier region 252 is a hole barrier, which contains 20 total layers, 10 WBG layers and 10 NBG layers. The thicknesses of the WBG layers in the energy barrier region 252 have been changed to form the hole barrier, such that some of the WBG layers in energy barrier region 252 are thinner than the WBG layers in the surrounding SL, and some of the WBG layers are thicker than the WBG layers in the surrounding SL. The total thickness of energy barrier region 252 is the same as 10 periods of the surrounding SL, and the SL on both sides of the energy barrier region 252 are aligned in energy.

The electron barrier is formed in energy barrier region 251 in FIG. 2A since the thicker WBG layers are positioned before the thinner WBG layers along the growth direction (i.e., moving from left to right in FIG. 2A) in the energy barrier region 251 in the figure. In contrast, the hole barrier is formed in energy barrier region 252 in FIG. 2B since the thinner WBG layers are positioned before the thicker WBG layers along the growth direction (i.e., moving from left to right in FIG. 2A) in the energy barrier region 252 in FIG. 2B. The electric fields in the layers cause the bands to increase or decrease in energy within a layer, and the electric fields are caused by a specific combination of polarity of the WBG and NBG layers. In other cases, the polarity of the WBG and NBG layers can be different and the energy barrier regions that form electron and hole barriers described herein can also be designed differently to account for the different electric fields.

Figure 2C:
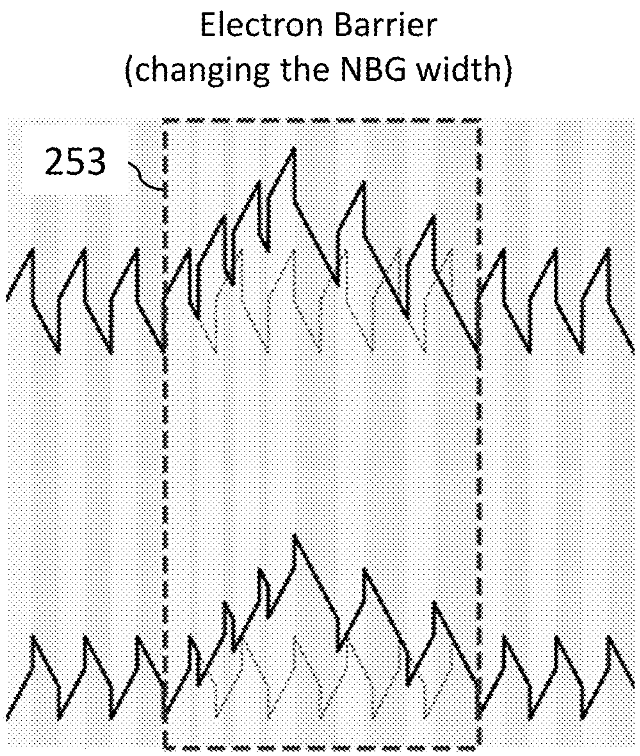
FIG. 2C shows an example band diagram of an SL with an energy barrier region, which is an electron barrier, embedded within an SL, in accordance with some embodiments.

FIG. 2C shows an example band diagram of an SL with an energy barrier region 253, which is an electron barrier in this case, embedded within an SL, in accordance with some embodiments. The energy barrier region 253 is an electron barrier, which contains 12 total layers (i.e., N=12), 6 WBG layers and 6 NBG layers. The thicknesses of the NBG layers in the energy barrier region 253 have been changed to form the electron barrier, such that some of the NBG layers in energy barrier region 253 are thinner than the NBG layers in the surrounding SL, and some of the NBG layers are thicker than the NBG layers in the surrounding SL. The total thickness of energy barrier region 253 is the same as 6 periods of the surrounding SL, and the SL on both sides of the energy barrier region 253 are aligned in energy.

Figure 2D:
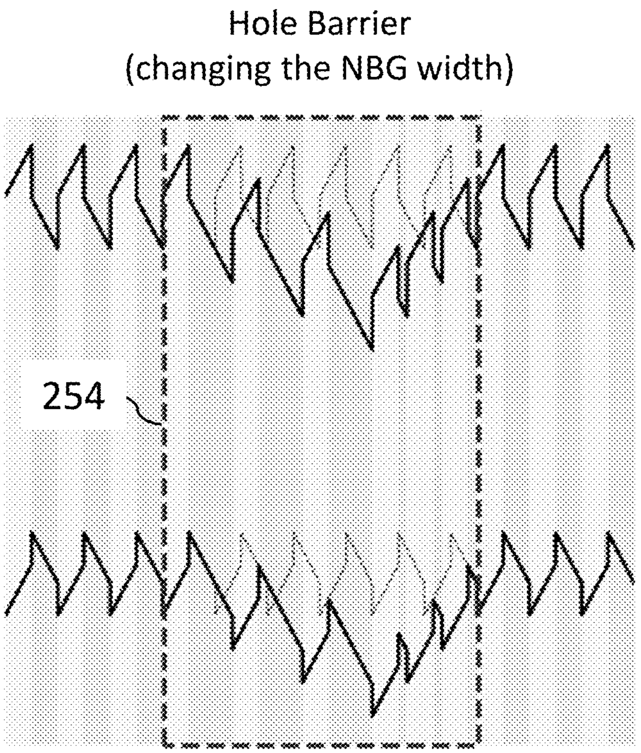
FIG. 2D shows an example band diagram of an SL with an energy barrier region, which is a hole barrier, embedded within an SL, in accordance with some embodiments.

FIG. 2D shows an example band diagram of an SL with an energy barrier region 254, which is a hole barrier in this case, embedded within an SL, in accordance with some embodiments. The energy barrier region 254 is a hole barrier, which contains 12 total layers, 6 WBG layers and 6 NBG layers. The thicknesses of the NBG layers in the energy barrier region 254 have been changed to form the hole barrier, such that some of the NBG layers in energy barrier region 254 are thicker than the NBG layers in the surrounding SL, and some of the NBG layers are thinner than the NBG layers in the surrounding SL. The total thickness of energy barrier region 254 is the same as 6 periods of the surrounding SL, and the SL on both sides of the energy barrier region 254 are aligned in energy.

The electron and hole barrier formed in energy barrier regions 253 and 254 in FIGS. 2A and 2B are formed using specific order of thicker NBG layers positioned before or after thinner NBG layers along the growth direction (i.e., moving from left to right in the figures), where the WBG layers are kept the same. The electric fields in the layers cause the bands to increase or decrease in energy within a layer, and the electric fields are caused by a specific combination of polarity of the WBG and NBG layers. In other cases, the polarity of the WBG and NBG layers can be different and the energy barrier regions that form electron and hole barriers described herein can also be designed differently to account for the different electric fields.

Figure 2E:
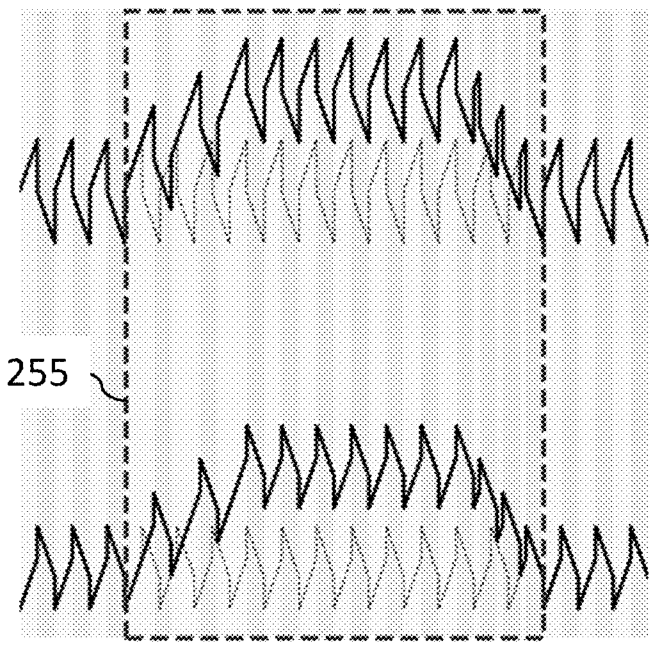
FIG. 2E shows an example band diagram of an SL with an energy barrier region, which is an electron barrier, embedded within an SL, in accordance with some embodiments.

FIG. 2E shows an example band diagram of an SL with an energy barrier region 255, which is an electron barrier in this case, embedded within an SL, in accordance with some embodiments. The energy barrier region 255 is an electron barrier with a flat top, which contains 24 total layers (i.e., N=24), 12 WBG layers and 12 NBG layers. The thicknesses of the WBG layers in the energy barrier region 255 have been changed to form the electron barrier with a flat top, such that some of the WBG layers in energy barrier region 255 are thicker than the WBG layers in the surrounding SL, some of the WBG layers have the same thicknesses as the WBG layers in the surrounding SL, and some of the WBG layers are thinner than the WBG layers in the surrounding SL. The total thickness of energy barrier region 255 is the same as 12 periods of the surrounding SL, and the SL on both sides of the energy barrier region 255 are aligned in energy.

Figure 2F:
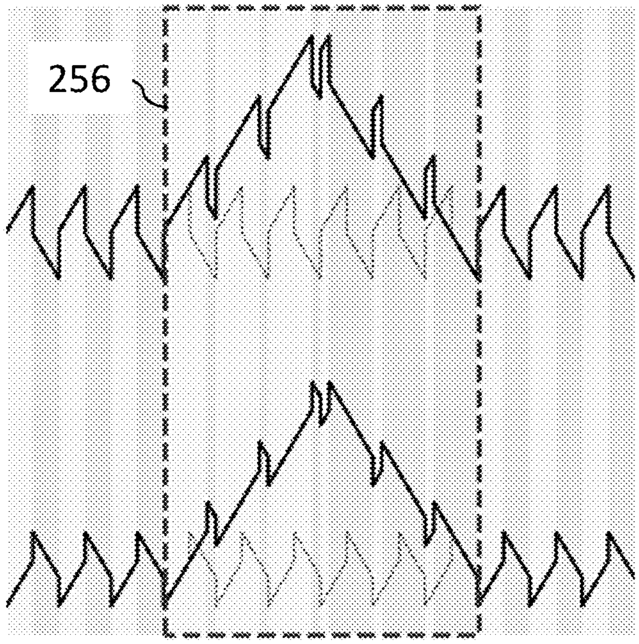
FIG. 2F shows an example band diagram of an SL with an energy barrier region, which is an electron barrier, embedded within an SL, in accordance with some embodiments.

FIG. 2F shows an example band diagram of an SL with an energy barrier region 256, which is an electron barrier in this case, embedded within an SL, in accordance with some embodiments. The energy barrier region 256 is an electron barrier, which contains 12 total layers, 6 WBG layers and 6 NBG layers. The thicknesses of both the WBG layers and the NBG layers in the energy barrier region 256 have been changed compared to those in the surrounding SL to form the electron barrier. In this example, some of the WBG layers in energy barrier region 256 are thicker than the WBG layers in the surrounding SL, and some of the WBG layers in energy barrier region 256 are thinner than the WBG layers in the surrounding SL. Additionally, some of the NBG layers in energy barrier region 256 are thinner than the NBG layers in the surrounding SL, and some of the NBG layers are thicker than the NBG layers in the surrounding SL. The total thickness of energy barrier region 256 is the same as 6 periods of the surrounding SL, and the SL on both sides of the energy barrier region 256 are aligned in energy.

In some cases, a semiconductor structure can include an SL and an energy barrier region in contact with the SL. The SL can include repeating unit cells, wherein each unit cell includes a narrow bandgap (NBG) layer including an NBG polar semiconductor material, and a wide bandgap (WBG) layer including a WBG polar semiconductor material. The energy barrier region can include a total of N layers, wherein N/2 of the N layers include the WBG polar semiconductor material, N/2 of the N layers include the NBG polar semiconductor material, the layers of the N layers including the WBG polar semiconductor material alternate with the layers of the N layers including the NBG polar semiconductor material, and a total thickness of the energy barrier region is equal to a thickness of N/2 unit cells of the SL.

In some cases, a first energy barrier layer of the N layers of the energy barrier region can include the WBG polar semiconductor material and can be thicker than the WBG layer of the unit cell of the SL (e.g., as in layer #1 in FIG. 1B with thickness 132), and a second energy barrier layer of the N layers of the energy barrier region can include the WBG polar semiconductor material and can be thinner than the WBG layer of the unit cell of the SL (e.g., as in layer #5 in FIG. 1B with thickness 134). The first energy barrier region can be positioned either before or after the second energy barrier region along the growth direction. Such examples are shown in FIGS. 1B, 2A and 2B. In some cases, additionally, a third energy barrier layer of the N layers of the energy barrier region comprises the NBG polar semiconductor material and is thicker than the NBG layer of the unit cell of the SL, and a fourth energy barrier layer of the N layers of the energy barrier region comprises the NBG polar semiconductor material and is thinner than the NBG layer of the unit cell of the SL. Such an example is shown in FIG. 2F.

In some cases, a first energy barrier layer of the N layers of the energy barrier region can include the NBG polar semiconductor material and can be thicker than the NBG layer of the unit cell of the SL, and a second energy barrier layer of the N layers of the energy barrier region can include the NBG polar semiconductor material and can be thinner than the NBG layer of the unit cell of the SL. Such examples are shown in FIGS. 2C and 2D.

In some cases, the energy barrier regions described herein can include a total of N layers, where N is an even number greater than 4 (or from 4 to 100, or greater than 100), half of the N layers comprise the WBG polar semiconductor material, half of the N layers comprise the NBG polar semiconductor material, and the layers of the N layers comprising the WBG polar semiconductor material alternate with the layers of the N layers comprising the NBG polar semiconductor material. A total thickness of the energy barrier region can be equal to a thickness of N/2 unit cells of the SL. The energy barrier region can further include a first energy barrier region bilayer comprising two adjacent layers of the N layers. A first layer of the two adjacent layers can include the WBG polar semiconductor material, and a second layer of the two adjacent layers can include the NBG polar semiconductor material. A thickness of the first energy barrier region bilayer can be greater than the thickness of the unit cell of the SL. The energy barrier region can also include a second energy barrier region bilayer comprising two adjacent layers of the N layers, wherein a thickness of the second energy barrier region bilayer is less than thickness of the unit cell of the SL. For example, layers #1 and #2 shown in energy barrier region 150 of FIG. 1B are a first bilayer that has a thickness that is greater than the thickness of the unit cell 106. Continuing with this example, layers #5 and #6 shown in energy barrier region 150 of FIG. 1B are a second bilayer that has a thickness that is less than the thickness of the unit cell 106. In other examples, layers #2 and #3, layers #3 and #4, and layers #7 and #8 are each bilayers of energy barrier region 150 in FIG. 1B.

In some cases, a layer of the two adjacent layers of the first energy barrier region bilayer includes the WBG polar semiconductor material and is thicker than the WBG layer of the unit cell of the SL (e.g., layer #1 of energy barrier region 150 in FIG. 1B), and a layer of the two adjacent layers of the second energy barrier region bilayer includes the WBG polar semiconductor material and is thinner than the WBG layer of the unit cell of the SL (e.g., layer #5 of energy barrier region 150 in FIG. 1B).

In some cases, a layer of the two adjacent layers of the first energy barrier region bilayer includes the NBG polar semiconductor material and is thicker than the NBG layer of the unit cell of the SL, and a layer of the two adjacent layers of the second energy barrier region bilayer includes the NBG polar semiconductor material and is thinner than the NBG layer of the unit cell of the SL. For example, the energy barrier region 253 in FIG. 2C has bilayers including layers including the NBG polar semiconductor material that are thicker than the NBG layer of the unit cell 106 of the SL, and bilayers including layers including the NBG polar semiconductor material that are thinner than the NBG layer of the unit cell 106 of the SL.

In some cases, a layer of the two adjacent layers of the first energy barrier region bilayer includes the WBG polar semiconductor material and is thicker or thinner than the WBG layer of the unit cell of the SL, a layer of the two adjacent layers of the second energy barrier region bilayer includes the WBG polar semiconductor material and is thicker or thinner than the WBG layer of the unit cell of the SL, a layer of the two adjacent layers of the first energy barrier region bilayer includes the NBG polar semiconductor material and is thicker or thinner than the NBG layer of the unit cell of the SL, and a layer of the two adjacent layers of the second energy barrier region bilayer includes the NBG polar semiconductor material and is thicker or thinner than the NBG layer of the unit cell of the SL. For example, the energy barrier region 256 in FIG. 2F has bilayers including layers including the WBG polar semiconductor material that are thicker than the WBG layer of the unit cell 106 of the SL and including layers including the NBG polar semiconductor material that are thinner than the NBG layer of the unit cell 106 of the SL. Continuing with this example, energy barrier region 256 in FIG. 2F also has bilayers including layers including the WBG polar semiconductor material that are thinner than the WBG layer of the unit cell 106 of the SL and including layers including the NBG polar semiconductor material that are thicker than the NBG layer of the unit cell 106 of the SL.

Figure 3A:
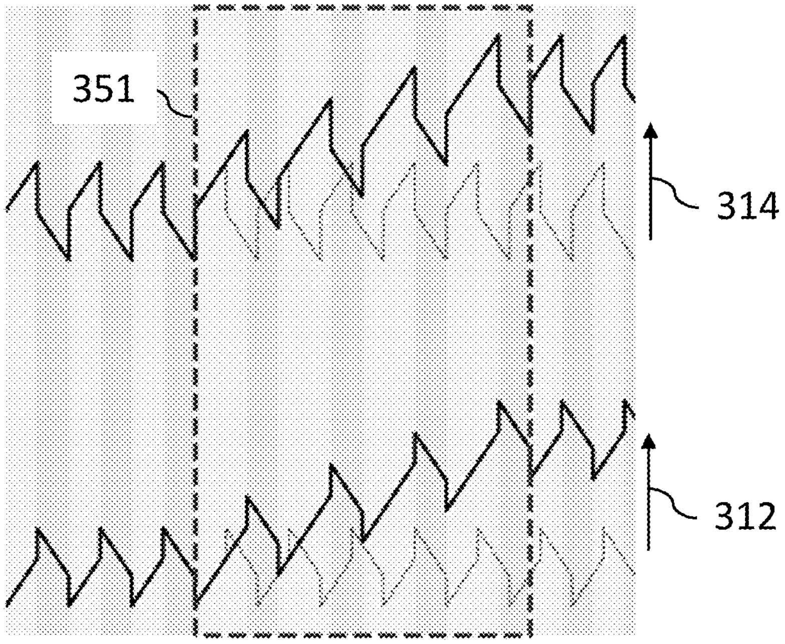
FIG. 3A shows a counter-example band diagram including an SL and a replacement region, embedded within an SL.
Figure 3B:
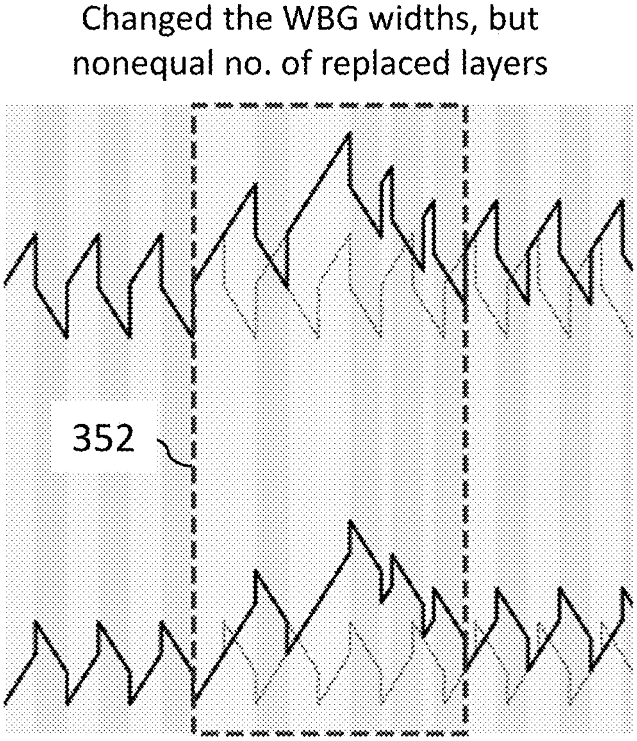
FIG. 3B shows a counter-example band diagram including an SL and a replacement region, embedded within an SL.

FIGS. 3A and 3B show counter-examples, where some of the design rules are not met, and the SL bands do not align on either side of the energy barriers.

FIG. 3A shows a counter-example band diagram including an SL and a replacement region 351, embedded within an SL. The replacement region 351 contains 8 total layers, 4 WBG layers and 4 NBG layers. The thicknesses of the WBG layers in the replacement region 351 have been changed such that all of the WBG layers in replacement region 351 are thicker than the WBG layers in the surrounding SL. The total thickness of replacement region 351 is therefore not the same as 4 periods of the surrounding SL, and the SL on both sides of the replacement region 351 are not aligned in energy. There are increases in energy 312 and 314 in the valence band edge and conduction band edge in this counter-example.

FIG. 3B shows a counter-example band diagram including an SL and a replacement region 352, embedded within an SL. The replacement region 352 contains 8 total layers, 4 WBG layers and 4 NBG layers. Some of the WBG layers in replacement region 352 are thicker than the WBG layers in the surrounding SL, and some of the WBG layers are thinner than the WBG layers in the surrounding SL. However, the total thickness of replacement region 352 is not the same as 4 periods of the surrounding SL, and the SL on both sides of the replacement region 352 are not aligned in energy.

Figure 4:
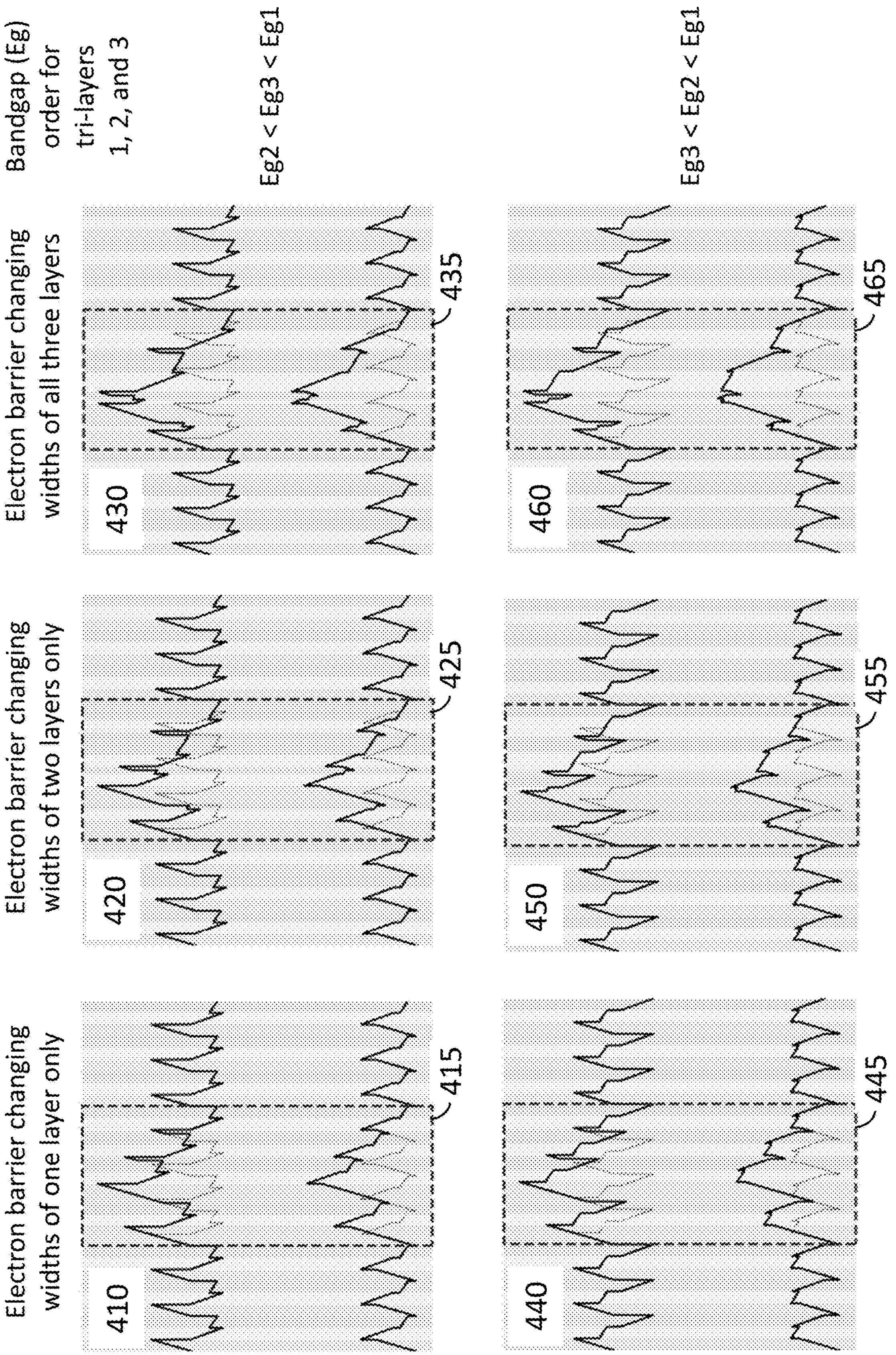
FIG. 4 shows examples of band diagrams of semiconductor structures similar to that shown in FIG. 1B, where each includes an energy barrier region embedded within an SL with a unit cell having three layers (i.e., a three-layer unit cell, or a tri-layered unit cell) of polar semiconductor materials, in accordance with some embodiments.

FIG. 4 shows examples of band diagrams of semiconductor structures similar to that shown in FIG. 1B, where each includes an energy barrier region embedded within an SL with a unit cell having three layers (i.e., a three-layer unit cell, or a tri-layered unit cell) of polar semiconductor materials, in accordance with some embodiments. Reference bands are also shown for the SL layers that have been replaced by the energy barrier regions in FIG. 4.

In some cases, SLs with three-layer unit cells include an NBG layer, a medium bandgap (MBG) layer, and a WBG layer, where the MBG layer contains a material with a bandgap between the bandgap of the material of the NBG and the bandgap of the material of the WBG layer. The energy barrier regions described herein (e.g., those shown in FIG. 4) can include the same three layers of the three-layer unit cells of the SL, where the thicknesses of one or more of the WBG layers, MBG layers, and NBG layers in the energy barrier are adjusted compared to the corresponding layers in the adjacent SL to form the energy barrier.

Within the SLs with three-layer unit cells, the interface charges depend on the materials in contact at the interfaces between the adjacent layers, and are generally not dependent on the thickness of each layer in the SL. The energy barrier region can be formed based on SLs having three-layer unit cells or having unit cells with more than three layers, where the number of layers and the order of the layers of the unit cell are not changed within the energy barrier region. In such cases, the total charge within the region that has been replaced will be unchanged (since the number of interfaces and their types are the same as the original SL).

The energy barrier (an electron or a hole barrier) can be formed by adjusting the individual widths of layers within the energy barrier region for structures with three-layer unit cells (or unit cells having more than three layers). The band alignment across the energy barrier region can be maintained by ensuring that the total width of the SL structure remains unchanged compared to the SL (had it not been replaced with the energy barrier region). That can be done by ensuring that the total thickness of each of the materials (summed over all SL periods that are being replaced) is also unchanged compared to the SL. Some examples of structures following these design limitations are shown in FIG. 4.

The examples in FIG. 4 are similar to those shown in FIGS. 2A-2F in that they represent metal-polar wurtzite materials (e.g., AlGaN materials), which have a polarization axis along the growth direction. In other cases, the wurtzite materials can be nitrogen-polar, and the field directions in the WBG and NBG materials would be inverted. For example, the structures simulated in band diagrams 410, 420, 430, 440, 450, and 460 would become hole barriers if N-polar oriented materials were used instead of materials that are oriented metal-polar. Additionally, as shown in FIG. 2A compared to FIG. 2B, the structures simulated in band diagrams 410, 420, 430, 440, 450, and 460 could also be designed as hole barriers if the order of the thick and thin layers within the energy barriers 415, 425, 435, 445, 455, and 465 were changed.

The three-layer unit cells contain a first layer, followed by a second layer, followed by a third layer. The structures simulated in band diagrams 410, 420, and 430 in FIG. 4 show examples where the bandgap of the first layer (a WBG layer) is larger than the bandgap of the third layer (an MBG layer), and the bandgap of the third layer (the MBG layer) is larger than the bandgap of the second layer (an NBG layer). The structures simulated in band diagrams 440, 450, and 460 in FIG. 4, on the other hand, show examples where the bandgap of the first layer (a WBG layer) is larger than the bandgap of the second layer (an NBG layer), and the bandgap of the third layer (the MBG layer) is larger than the bandgap of the second layer (an NBG layer).

Band diagrams 410 and 440 in FIG. 4 show examples of energy barrier regions 415 and 445, where the thicknesses of only one layer of the three-layer unit cell of the SL are changed to form the energy barrier region 415 or 445. In these examples the thicknesses of the WBG layer (the first layer) in the unit cell are changed to form the energy barrier region, but in other cases, thicknesses of the MBG layer or NBG layer of the unit cell can be changed to form the energy barrier region.

Band diagrams 420 and 450 in FIG. 4 show examples of energy barrier regions 425 and 455, where the thicknesses of two layers of the three-layer unit cell of the SL are changed to form the energy barrier region 425 or 455. In these examples the thicknesses of the first layer (WBG layer) and the thicknesses of the third layer (MBG layer in band diagram 420, or NBG layer in band diagram 450) in the unit cell are changed to form the energy barrier region, but in other cases, thicknesses of the first layer (WBG layer) and second layer (NBG layer in band diagram 420, or MBG layer in band diagram 450), or the second layer and third layer (MBG layer in band diagram 420, or NBG layer in band diagram 450) of the unit cell can be changed to form the energy barrier region.

Band diagrams 430 and 460 in FIG. 4 show examples of energy barrier regions 435 and 465, where the thicknesses of all three layers of the three-layer unit cell of the SL are changed to form the energy barrier region 435 or 465.

Figure 5:
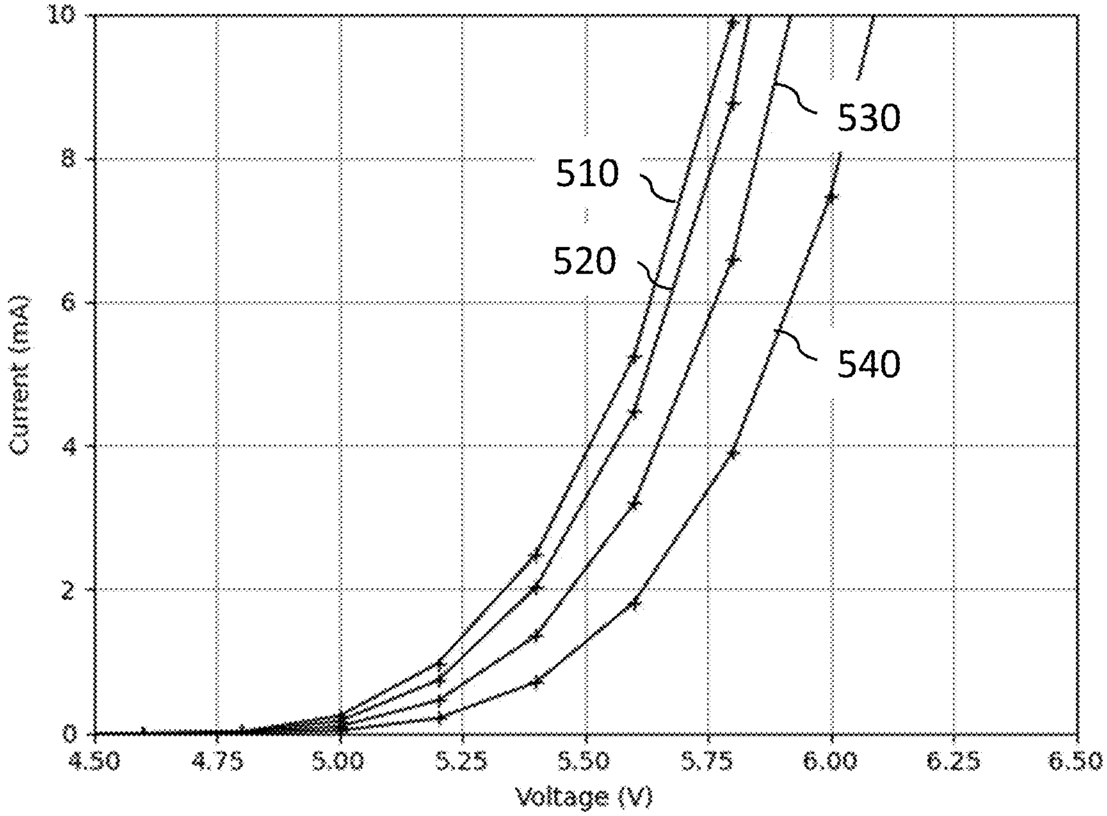
FIG. 5 shows experimental current-voltage (I-V) data from devices that contained GaN/AlN SLs and different energy barrier regions.

FIG. 5 shows experimental current-voltage (I-V) data from devices that contained GaN/AlN SLs and different energy barrier regions. The x-axis is voltage (in V) and the y-axis is current (in mA). The current-voltage (IV) curves 510, 520, 530 and 540 show the effect of adding an energy barrier region to a PIN semiconductor device structure with GaN/AlN SLs. In this example, the n-type region of the PIN structure was a first GaN/AlN SL, the intrinsic (or not intentionally doped) region was a second GaN/AlN SL, and the p-type region was a layer of GaN. The energy barrier was positioned in the intrinsic region, at the edge (start) that was adjacent to the SL of the n-type region. The data plotted shows the average performance of tests of several structures to remove spatial variability in the materials growth and semiconductor device fabrication processes. The intrinsic layer of the PIN diodes in these examples was an AlN/GaN SL.

The energy barrier regions in the examples plotted in FIG. 5 were formed by replacing N periods of the SL with an energy barrier structure including N/3 periods with double the AlN thickness compared to the SL, and 2N/3 periods of half the AlN thickness compared to the SL. The energy barrier regions in this example are similar to energy barrier region 251 shown in FIG. 2A, but the energy barrier regions in this example have different thicknesses and numbers of thicker and thinner WBG layers than those of energy barrier region 251. The total thickness of the replaced periods of the SL remained unchanged. The GaN width of all examples was the same, and it was unchanged in the barrier structure compared to the rest of the SL. The height and width of the energy barriers were changed in the different examples by increasing the number of periods replaced, wherein a larger and wider the energy barrier was formed by replacing more periods of the SL.

The I-V curve 510 shows data from a device with no energy barrier in the SL, and displays the lowest turn-on voltage. The I-V curve 520 shows data from a device with an energy barrier formed by replacing six periods of the SL (six layers of GaN and six layers of AlN). The I-V curve 520 shows a higher turn-on voltage due to the presence of the energy barrier. The I-V curve 530 shows data from a device with an energy barrier formed by replacing nine periods of the SL, and I-V curve 540 shows data from a device with an energy barrier formed by replacing twelve periods of the SL. Accordingly, I-V curves 530 and 540 show higher turn-on voltages due to the presence of the larger energy barriers.

The electrical characteristics clearly show an increase in voltage for larger barriers, which confirmed the effectiveness of the energy barrier regions described herein. Not to be limited by theory, most of the current is conducted by electrons, which are much more mobile than holes, and hence inserting a barrier for electrons means that to drive the same total current, a bigger voltage is needed to surmount that additional barrier. The amount of additional voltage needed increased monotonically as the height and width of the barrier was increased by including additional periods. This experimental data shows that the energy barriers described herein impact the electrical performance of devices, and that different barriers can be made with different barrier heights to impact the electrical performance differently.

Embodiments

Clause 1. A semiconductor structure comprising: a superlattice comprising repeating unit cells, wherein each unit cell comprises a narrow bandgap (NBG) layer comprising an NBG polar semiconductor material, and a wide bandgap (WBG) layer comprising a WBG polar semiconductor material; and an energy barrier region in contact with the superlattice, the energy barrier region comprising a total of N layers, wherein Nis an even number greater than or equal to 4, half of the N layers comprise the WBG polar semiconductor material, half of the N layers comprise the NBG polar semiconductor material, the layers of the N layers comprising the WBG polar semiconductor material alternate with the layers of the N layers comprising the NBG polar semiconductor material, and a total thickness of the energy barrier region is equal to a thickness of N/2 unit cells of the superlattice; wherein a first energy barrier layer of the N layers of the energy barrier region that comprises the WBG polar semiconductor material is thicker than the WBG layer of the unit cell of the superlattice, and a second energy barrier layer of the N layers of the energy barrier region that comprises the WBG polar semiconductor material is thinner than the WBG layer of the unit cell of the superlattice.

Clause 2. The semiconductor structure of clause 1, wherein N is from 4 to 100.

Clause 3. The semiconductor structure of clause 1, wherein the WBG and the NBG polar semiconductor materials comprise nitride materials with wurtzite crystal structures.

Clause 4. The semiconductor structure of clause 1, wherein the WBG and the NBG polar semiconductor materials comprise one or more of GaN, AlN, Alx1Ga1-x1N where $0 \le x1 \le 1$, and Inx2Aly2Ga1-x2-y2N where $0 \le x2 \le 1$, $0 \le y2 \le 1$, and $x2+y2 \le 1$.

Clause 5. The semiconductor structure of clause 1, wherein the superlattice and the energy barrier region are formed using an epitaxial growth technique.

Clause 6. The semiconductor structure of clause 1, wherein the superlattice is a first superlattice on a first side of the energy barrier region, and wherein the semiconductor structure further comprises a second superlattice in contact with a second side of the energy barrier region such that the energy barrier region is between the first superlattice and the second superlattice, wherein the second superlattice comprises repeating instances of the unit cell of the first superlattice, and wherein valence band and conduction band edges of the first superlattice are aligned in energy with valence band and conduction band edges of the second superlattice.

Clause 7. The semiconductor structure of clause 1, wherein a third energy barrier layer of the N layers of the energy barrier region that comprises the NBG polar semiconductor material is thicker than the NBG layer of the unit cell of the superlattice, and a fourth energy barrier layer of the N layers of the energy barrier region that comprises the NBG polar semiconductor material is thinner than the NBG layer of the unit cell of the superlattice.

Clause 8. The semiconductor structure of clause 1, wherein the energy barrier region comprises an electron barrier.

Clause 9. The semiconductor structure of clause 1, wherein the energy barrier region comprises a hole barrier.

Clause 10. A semiconductor structure comprising: a superlattice comprising repeating unit cells, wherein each unit cell comprises a narrow bandgap (NBG) layer comprising an NBG polar semiconductor material, and a wide bandgap (WBG) layer comprising a WBG polar semiconductor material; and an energy barrier region in contact with the superlattice, the energy barrier region comprising a total of N layers, wherein Nis an even number greater than or equal to 4, half of the N layers comprise the WBG polar semiconductor material, half of the N layers comprise the NBG polar semiconductor material, the layers of the N layers comprising the WBG polar semiconductor material alternate with the layers of the N layers comprising the NBG polar semiconductor material, and a total thickness of the energy barrier region is equal to a thickness of N/2 unit cells of the superlattice; wherein a first energy barrier layer of the N layers of the energy barrier region that comprises the NBG polar semiconductor material is thicker than the NBG layer of the unit cell of the superlattice, and a second energy barrier layer of the N layers of the energy barrier region that comprises the NBG polar semiconductor material is thinner than the NBG layer of the unit cell of the superlattice.

Clause 11. The semiconductor structure of clause 10, wherein N is from 4 to 100.

Clause 12. The semiconductor structure of clause 10, wherein the WBG and the NBG polar semiconductor materials comprise nitride materials with wurtzite crystal structures.

Clause 13. The semiconductor structure of clause 10, wherein the WBG and the NBG polar semiconductor materials comprise one or more of GaN, AlN, Alx1Ga1-x1N where 0≤x1≤1, and Inx2Aly2Ga1-x2-y2N where 0≤x2≤1, 0≤y2≤1, and x2+y2≤1.

Clause 14. The semiconductor structure of clause 10, wherein the superlattice and the energy barrier region are formed using an epitaxial growth technique.

Clause 15. The semiconductor structure of clause 10, wherein the superlattice is a first superlattice on a first side of the energy barrier region, and wherein the semiconductor structure further comprises a second superlattice in contact with a second side of the energy barrier region such that the energy barrier region is between the first superlattice and the second superlattice, wherein the second superlattice comprises repeating instances of the unit cell of the first superlattice, and wherein valence band and conduction band edges of the first superlattice are aligned in energy with valence band and conduction band edges of the second superlattice.

Clause 16. The semiconductor structure of clause 10, wherein the energy barrier region comprises an electron barrier.

Clause 17. The semiconductor structure of clause 10, wherein the energy barrier region comprises a hole barrier.

Clause 18. A semiconductor structure comprising: a superlattice comprising repeating unit cells, wherein each unit cell comprises a narrow bandgap (NBG) layer comprising an NBG polar semiconductor material, and a wide bandgap (WBG) layer comprising a WBG polar semiconductor material; and an energy barrier region in contact with the superlattice, wherein the energy barrier region comprises: a total of N layers, wherein N is an even number greater than 4, half of the N layers comprise the WBG polar semiconductor material, half of the N layers comprise the NBG polar semiconductor material, and the layers of the N layers comprising the WBG polar semiconductor material alternate with the layers of the N layers comprising the NBG polar semiconductor material; a total thickness equal to a thickness of N/2 unit cells of the superlattice; a first energy barrier region bilayer comprising two adjacent layers of the N layers, wherein a thickness of the first energy barrier region bilayer is greater than thickness of the unit cell of the superlattice; and a second energy barrier region bilayer comprising two adjacent layers of the N layers, wherein a thickness of the second energy barrier region bilayer is less than thickness of the unit cell of the superlattice.

Clause 19. The semiconductor structure of clause 18, wherein a layer of the two adjacent layers of the first energy barrier region bilayer that comprises the WBG polar semiconductor material is thicker than the WBG layer of the unit cell of the superlattice, and wherein a layer of the two adjacent layers of the second energy barrier region bilayer that comprises the WBG polar semiconductor material is thinner than the WBG layer of the unit cell of the superlattice.

Clause 20. The semiconductor structure of clause 18, wherein a layer of the two adjacent layers of the first energy barrier region bilayer that comprises the NBG polar semiconductor material is thicker than the NBG layer of the unit cell of the superlattice, and wherein a layer of the two adjacent layers of the second energy barrier region bilayer that comprises the NBG polar semiconductor material is thinner than the NBG layer of the unit cell of the superlattice.

In some cases, a single embodiment may, for succinctness and/or to assist in understanding the scope of the disclosure, combine multiple features. It is to be understood that in such a case, these multiple features may be provided separately (in separate embodiments), or in any other suitable combination. Alternatively, where separate features are described in separate embodiments, these separate features may be combined into a single embodiment unless otherwise stated or implied. This also applies to the claims which can be recombined in any combination. That is, a claim may be amended to include a feature defined in any other claim. Furthermore, a phrase referring to "at least one of" a list of items refers to any combination of those items, including single members. As an example, "at least one of: a, b, or c" is intended to cover: a, b, c, a-b, a-c, b-c, and a-b-c.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only and is not intended to limit the invention.

What is claimed is:

1. A semiconductor structure comprising:

a superlattice comprising repeating unit cells, wherein each unit cell comprises a narrow bandgap (NBG) layer comprising an NBG polar semiconductor material, and a wide bandgap (WBG) layer comprising a WBG polar semiconductor material; and an energy barrier region in contact with the superlattice, the energy barrier region comprising a total of N layers, wherein N is an even number greater than or equal to 4, half of the N layers comprise the WBG polar semiconductor material, half of the N layers comprise the NBG polar semiconductor material, the layers of the N layers comprising the WBG polar semiconductor material alternate with the layers of the N layers comprising the NBG polar semiconductor material, and a total thickness of the energy barrier region is equal to a thickness of N/2 unit cells of the superlattice;

wherein a first energy barrier layer of the N layers of the energy barrier region that comprises the WBG polar semiconductor material is thicker than the WBG layer of the unit cell of the superlattice, and a second energy barrier layer of the N layers of the energy barrier region that comprises the WBG polar semiconductor material is thinner than the WBG layer of the unit cell of the superlattice.

2. The semiconductor structure of claim 1, wherein N is from 4 to 100.

3. The semiconductor structure of claim 1, wherein the WBG and the NBG polar semiconductor materials comprise nitride materials with wurtzite crystal structures.

4. The semiconductor structure of claim 1, wherein the WBG and the NBG polar semiconductor materials comprise one or more of GaN, AlN, $Al_{x1}Ga_{1-x1}N$ where $0 \le x1 \le 1$, and $In_{x2}Al_{y2}Ga_{1-x2-y2}N$ where $0 \le x2 \le 1$, $0 \le y2 \le 1$, and $x2+y2 \le 1$.

5. The semiconductor structure of claim 1, wherein the superlattice and the energy barrier region are formed using an epitaxial growth technique.

6. The semiconductor structure of claim 1, wherein the superlattice is a first superlattice on a first side of the energy barrier region, and wherein the semiconductor structure further comprises a second superlattice in contact with a second side of the energy barrier region such that the energy barrier region is between the first superlattice and the second superlattice, wherein the second superlattice comprises repeating instances of the unit cell of the first superlattice, and wherein valence band and conduction band edges of the first superlattice are aligned in energy with valence band and conduction band edges of the second superlattice.

7. The semiconductor structure of claim 1, wherein a third energy barrier layer of the N layers of the energy barrier region that comprises the NBG polar semiconductor material is thicker than the NBG layer of the unit cell of the superlattice, and a fourth energy barrier layer of the N layers of the energy barrier region that comprises the NBG polar semiconductor material is thinner than the NBG layer of the unit cell of the superlattice.

8. The semiconductor structure of claim 1, wherein the energy barrier region comprises an electron barrier.

9. The semiconductor structure of claim 1, wherein the energy barrier region comprises a hole barrier.

10. A semiconductor structure comprising:

a superlattice comprising repeating unit cells, wherein each unit cell comprises a narrow bandgap (NBG) layer comprising an NBG polar semiconductor material, and a wide bandgap (WBG) layer comprising a WBG polar semiconductor material; and an energy barrier region in contact with the superlattice, the energy barrier region comprising a total of N layers, wherein N is an even number greater than or equal to 4, half of the N layers comprise the WBG polar semiconductor material, half of the N layers comprise the NBG polar semiconductor material, the layers of the N layers comprising the WBG polar semiconductor material alternate with the layers of the N layers comprising the NBG polar semiconductor material, and a total thickness of the energy barrier region is equal to a thickness of N/2 unit cells of the superlattice;

wherein a first energy barrier layer of the N layers of the energy barrier region that comprises the NBG polar semiconductor material is thicker than the NBG layer of the unit cell of the superlattice, and a second energy barrier layer of the N layers of the energy barrier region that comprises the NBG polar semiconductor material is thinner than the NBG layer of the unit cell of the superlattice.

11. The semiconductor structure of claim 10, wherein Nis from 4 to 100.

12. The semiconductor structure of claim 10, wherein the WBG and the NBG polar semiconductor materials comprise nitride materials with wurtzite crystal structures.

13. The semiconductor structure of claim 10, wherein the WBG and the NBG polar semiconductor materials comprise one or more of GaN, AlN, $Al_{x1}Ga_{1-x1}N$ where $0 \le x1 \le 1$, $In_{x2}Al_{y2}Ga_{1-x2-y2}N$ where $0 \le x2 \le 1$, $0 \le y2 \le 1$, and $x2+y2 \le 1$, and $B_{x3}Al_{y3}Ga_{1-x3-y3}N$, where $0 \le x3 \le 1$, $0 \le y3 \le 1$, and $x3+y3 \le 1$.

14. The semiconductor structure of claim 10, wherein the superlattice and the energy barrier region are formed using an epitaxial growth technique.

15. The semiconductor structure of claim 10, wherein the superlattice is a first superlattice on a first side of the energy barrier region, and wherein the semiconductor structure further comprises a second superlattice in contact with a second side of the energy barrier region such that the energy barrier region is between the first superlattice and the second superlattice, wherein the second superlattice comprises repeating instances of the unit cell of the first superlattice, and wherein valence band and conduction band edges of the first superlattice are aligned in energy with valence band and conduction band edges of the second superlattice.

16. The semiconductor structure of claim 10, wherein the energy barrier region comprises an electron barrier.

17. The semiconductor structure of claim 10, wherein the energy barrier region comprises a hole barrier.

18. A semiconductor structure comprising:

a superlattice comprising repeating unit cells, wherein each unit cell comprises a narrow bandgap (NBG) layer comprising an NBG polar semiconductor material, and a wide bandgap (WBG) layer comprising a WBG polar semiconductor material; and an energy barrier region in contact with the superlattice, wherein the energy barrier region comprises:

a total of N layers, wherein Nis an even number greater than 4, half of the N layers comprise the WBG polar semiconductor material, half of the N layers comprise the NBG polar semiconductor material, and the layers of the N layers comprising the WBG polar semiconductor material alternate with the layers of the N layers comprising the NBG polar semiconductor material;

a total thickness equal to a thickness of N/2 unit cells of the superlattice;

a first energy barrier region bilayer comprising two adjacent layers of the N layers, wherein a thickness of the first energy barrier region bilayer is greater than thickness of the unit cell of the superlattice; and a second energy barrier region bilayer comprising two adjacent layers of the N layers, wherein a thickness of the second energy barrier region bilayer is less than thickness of the unit cell of the superlattice.

19. The semiconductor structure of claim 18, wherein a layer of the two adjacent layers of the first energy barrier region bilayer that comprises the WBG polar semiconductor material is thicker than the WBG layer of the unit cell of the superlattice, and wherein a layer of the two adjacent layers of the second energy barrier region bilayer that comprises the WBG polar semiconductor material is thinner than the WBG layer of the unit cell of the superlattice.

20. The semiconductor structure of claim 18, wherein a layer of the two adjacent layers of the first energy barrier region bilayer that comprises the NBG polar semiconductor material is thicker than the NBG layer of the unit cell of the superlattice, and wherein a layer of the two adjacent layers of the second energy barrier region bilayer that comprises the NBG polar semiconductor material is thinner than the NBG layer of the unit cell of the superlattice.

* * * * *